(12) United States Patent
Chen et al.

(10) Patent No.: US 10,755,941 B2
(45) Date of Patent: Aug. 25, 2020

(54) SELF-LIMITING SELECTIVE ETCHING SYSTEMS AND METHODS

(71) Applicant: Applied Materials, Inc., Santa Clara, CA (US)

(72) Inventors: Zhijun Chen, San Jose, CA (US); Chia-Ling Kao, San Jose, CA (US); Anchuan Wang, San Jose, CA (US); Nitin Ingle, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/028,671

(22) Filed: Jul. 6, 2018

(65) Prior Publication Data

US 2020/0013628 A1    Jan. 9, 2020

(51) Int. Cl.
| | |
|---|---|
| *H01L 21/3065* | (2006.01) |
| *H01L 21/3213* | (2006.01) |
| *H01L 21/308* | (2006.01) |
| *H01L 21/311* | (2006.01) |
| *H01L 21/306* | (2006.01) |
| *H01L 21/02* | (2006.01) |
| *H01L 21/67* | (2006.01) |
| *H01J 37/00* | (2006.01) |

(52) U.S. Cl.
CPC .... *H01L 21/3065* (2013.01); *H01L 21/02041* (2013.01); *H01L 21/308* (2013.01); *H01L 21/30604* (2013.01); *H01L 21/30621* (2013.01); *H01L 21/311* (2013.01); *H01L 21/32135* (2013.01); *H01L 21/32136* (2013.01); *H01L 21/67069* (2013.01)

(58) Field of Classification Search
None
See application file for complete search history.

(56) References Cited

U.S. PATENT DOCUMENTS

| | | |
|---|---|---|
| 2,369,620 A | 2/1945 | Sullivan et al. |
| 3,401,302 A | 9/1968 | Thorpe |
| 3,451,840 A | 6/1969 | Hough |
| 3,537,474 A | 11/1970 | Rohrer |
| 3,756,511 A | 9/1973 | Shinroku |

(Continued)

FOREIGN PATENT DOCUMENTS

| | | |
|---|---|---|
| CN | 1124364 A | 6/1996 |
| CN | 1847450 A | 10/2006 |

(Continued)

*Primary Examiner* — Stephanie P Duclair
(74) *Attorney, Agent, or Firm* — Kilpatrick Townsend & Stockton LLP

(57) ABSTRACT

Exemplary etching methods may include flowing a hydrogen-containing precursor into a substrate processing region of a semiconductor processing chamber. The methods may include flowing a fluorine-containing precursor into the substrate processing region. The methods may include contacting a substrate housed in the substrate processing region with the hydrogen-containing precursor and the fluorine-containing precursor. The substrate may define a trench, and a layer of an oxygen-containing material may be disposed within the trench and exposed on the substrate. The methods may include halting delivery of the hydrogen-containing precursor. The methods may also include removing the oxygen-containing material.

19 Claims, 7 Drawing Sheets

(56) References Cited

U.S. PATENT DOCUMENTS

| | | |
|---|---|---|
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,503,807 A | 3/1985 | Nakayama et al. |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desliets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Loewenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,987,856 A | 1/1991 | Hey et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchaikit et al. |
| 5,215,787 A | 6/1993 | Homma |
| 5,217,559 A | 6/1993 | Moslehi et al. |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,169 A | 9/1995 | Corbett, III et al. |
| 5,451,259 A | 9/1995 | Krogh |
| 5,454,170 A | 10/1995 | Cook |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |

(56) References Cited

U.S. PATENT DOCUMENTS

| | | |
|---|---|---|
| 5,556,521 A | 9/1996 | Ghanbari |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,385 A | 12/1996 | Paranjpe et al. |
| 5,580,421 A | 12/1996 | Hiatt et al. |
| 5,591,269 A | 1/1997 | Arami et al. |
| 5,592,358 A | 1/1997 | Shamouilian et al. |
| 5,595,606 A | 1/1997 | Fujikawa et al. |
| 5,597,439 A | 1/1997 | Salzman |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasegawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Shacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker et al. |
| 5,865,896 A | 2/1999 | Nowak et al. |
| 5,866,483 A | 2/1999 | Shiau et al. |
| 5,868,897 A | 2/1999 | Ohkawa |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,928,528 A | 7/1999 | Kubota et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawili |
| 5,953,591 A | 9/1999 | Ishihara et al. |
| 5,953,635 A | 9/1999 | Andideh |
| 5,963,840 A | 10/1999 | Xia et al. |
| 5,968,379 A | 10/1999 | Zhao et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,982,100 A | 11/1999 | Ghanbari |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,649 A | 12/1999 | Hillman |
| 5,997,721 A | 12/1999 | Limbach et al. |
| 5,997,962 A | 12/1999 | Ogasawara et al. |
| 6,004,884 A | 12/1999 | Abraham |
| 6,007,635 A | 12/1999 | Mahawili |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,019,848 A | 2/2000 | Kiyama et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |

(56) References Cited

U.S. PATENT DOCUMENTS

| | | |
|---|---|---|
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,386 A | 6/2000 | Smith, Jr. et al. |
| 6,077,780 A | 6/2000 | Dubin |
| 6,079,356 A | 6/2000 | Umotoy et al. |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawili |
| 6,093,457 A | 7/2000 | Okumura et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,124,003 A | 9/2000 | Mikami et al. |
| 6,126,753 A | 10/2000 | Shinriki et al. |
| 6,132,512 A | 10/2000 | Hone et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,170,429 B1 | 1/2001 | Schoepp |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsiung et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,200,412 B1 | 3/2001 | Kilgore et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,198,616 B1 | 6/2001 | Dahimene et al. |
| 6,241,845 B1 | 6/2001 | Gadgil et al. |
| 6,242,349 B1 | 6/2001 | Nogarni et al. |
| 6,242,360 B1 | 6/2001 | Fischer et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,302,964 B1 | 10/2001 | Umotoy |
| 6,303,044 B1 | 10/2001 | Koemtzopoulos et al. |
| 6,303,418 B1 | 10/2001 | Cha et al. |
| 6,306,246 B1 | 10/2001 | Melvin et al. |
| 6,306,772 B1 | 10/2001 | Lin |
| 6,308,654 B1 | 10/2001 | Schneider et al. |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawili |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |

(56) References Cited

U.S. PATENT DOCUMENTS

| | | |
|---|---|---|
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,437,512 B1 | 8/2002 | Chen et al. |
| 6,440,863 B1 | 8/2002 | Tsai et al. |
| 6,441,492 B1 | 8/2002 | Cunningham |
| 6,444,083 B1 | 9/2002 | Steger et al. |
| 6,446,572 B1 | 9/2002 | Brcka |
| 6,447,636 B1 | 9/2002 | Qian et al. |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,463,782 B1 | 10/2002 | Shen et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,673,200 B1 | 1/2004 | Gu et al. |
| 6,677,242 B1 | 1/2004 | Liu et al. |
| 6,679,981 B1 | 1/2004 | Parr et al. |
| 6,688,375 B1 | 2/2004 | Turner et al. |
| 6,692,903 B2 | 2/2004 | Chen et al. |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fischer |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,818,561 B1 | 11/2004 | Sonderman |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,401 B2 | 1/2005 | Wijenberg et al. |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzorr et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,972,840 B1 | 12/2005 | Gu et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,049,244 B2 | 5/2006 | Becker et al. |
| 7,052,553 B1 | 5/2006 | Shih et al. |

(56) References Cited

U.S. PATENT DOCUMENTS

| | | |
|---|---|---|
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoronyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,906,818 B2 | 3/2011 | Pekny |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hod et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,199,454 B2 | 6/2012 | Koyama et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,343,306 B2 | 1/2013 | Tanaka et al. |
| 8,357,435 B2 | 1/2013 | Lubomirsky |
| 8,361,892 B2 | 1/2013 | Tam et al. |
| 8,368,308 B2 | 2/2013 | Banna et al. |
| 8,390,980 B2 | 3/2013 | Sansoni et al. |
| 8,398,777 B2 | 3/2013 | Collins et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Nakano et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,354 B2 | 3/2014 | O'Hara |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,610 B2 | 6/2014 | Chen et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa et al. |
| 8,871,651 B1 | 10/2014 | Choi et al. |
| 8,888,087 B2 | 11/2014 | Okabe et al. |
| 8,894,767 B2 | 11/2014 | Goradia et al. |

(56) References Cited

U.S. PATENT DOCUMENTS

| | | |
|---|---|---|
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,068,265 B2 | 6/2015 | Lubomirsky et al. |
| 9,072,158 B2 | 6/2015 | Ikeda et al. |
| 9,093,371 B2 | 7/2015 | Wang et al. |
| 9,093,389 B2 | 7/2015 | Nemani |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,267,739 B2 | 2/2016 | Chen et al. |
| 9,269,590 B2 | 2/2016 | Luere et al. |
| 9,275,834 B1 | 3/2016 | Park et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,539 B2 | 3/2016 | Makhratchev |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhange et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry et al. |
| 9,425,057 B2 | 8/2016 | Cho et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,343,358 B1 | 9/2016 | Montgomery |
| 9,437,451 B2 | 9/2016 | Chen et al. |
| 9,443,749 B2 | 9/2016 | Wakabayashi et al. |
| 9,449,843 B1 | 9/2016 | Korolik et al. |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,534,724 B2 | 1/2017 | Jiang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,812,462 B1 | 11/2017 | Pang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |

(56) References Cited

U.S. PATENT DOCUMENTS

| | | |
|---|---|---|
| 9,941,097 B2 | 4/2018 | Yamazawa |
| 9,947,549 B1 | 4/2018 | Park et al. |
| 9,960,045 B1 | 5/2018 | Purayath et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 10,083,830 B2 | 9/2018 | Seino et al. |
| 10,121,689 B2 | 11/2018 | Konkola et al. |
| 10,147,620 B2 | 12/2018 | Benjaminson et al. |
| 10,147,736 B2 | 12/2018 | Linuma |
| 10,269,541 B2 | 4/2019 | Stowell et al. |
| 10,319,739 B2 | 6/2019 | Purayath |
| 2001/0003014 A1 | 6/2001 | Yuda |
| 2001/0006093 A1 | 7/2001 | Tabuchi |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0023741 A1 | 9/2001 | Collison et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0042512 A1 | 11/2001 | Xu et al. |
| 2001/0042799 A1 | 11/2001 | Kim et al. |
| 2001/0045269 A1 | 11/2001 | Yamada |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2002/0000202 A1 | 1/2002 | Yuda et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0020429 A1 | 2/2002 | Selbrede et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0042192 A1 | 4/2002 | Tanaka et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0048963 A1 | 4/2002 | Campbell et al. |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0075624 A1 | 6/2002 | Wang et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky |
| 2002/0182878 A1 | 12/2002 | Hirose et al. |
| 2002/0185226 A1 | 12/2002 | Lea et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000647 A1 | 1/2003 | Yudovsky et al. |
| 2003/0003757 A1 | 1/2003 | Nallan et al. |
| 2003/0007910 A1 | 1/2003 | Lazarovich et al. |
| 2003/0010452 A1 | 1/2003 | Park et al. |
| 2003/0010645 A1 | 1/2003 | Ting et al. |
| 2003/0015515 A1 | 1/2003 | Ito et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0101938 A1 | 6/2003 | Ronsse et al. |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0119328 A1 | 6/2003 | Fujisato |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |

(56) References Cited

U.S. PATENT DOCUMENTS

| | | |
|---|---|---|
| 2003/0190426 A1 | 10/2003 | Padhi et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0201764 A1 | 10/2003 | Jafari et al. |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0002221 A1 | 1/2004 | O'Donnell et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0118519 A1 | 6/2004 | Sen et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149387 A1 | 8/2004 | Kim et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0163601 A1 | 8/2004 | Kadotani et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0201843 A1 | 10/2004 | Glenn et al. |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0263827 A1 | 12/2004 | Xu |
| 2005/0000430 A1 | 1/2005 | Jang et al. |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217582 A1 | 10/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0241579 A1 | 11/2005 | Kidd |
| 2005/0241583 A1 | 11/2005 | Buechel et al. |
| 2005/0241763 A1 | 11/2005 | Huang et al. |
| 2005/0251990 A1 | 11/2005 | Choi et al. |
| 2005/0257890 A1 | 11/2005 | Park et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0274396 A1 | 12/2005 | Shih et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |

(56) References Cited

U.S. PATENT DOCUMENTS

| | | |
|---|---|---|
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0032833 A1 | 2/2006 | Kawaguchi et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1 | 3/2006 | Jang |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0137613 A1 | 6/2006 | Kasai |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207724 A1* | 9/2006 | Shinriki ............... B08B 7/0035 156/345.35 |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0285270 A1 | 12/2006 | Lee |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0022954 A1 | 2/2007 | Iizuka et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0128876 A1 | 6/2007 | Fukiage |
| 2007/0131274 A1 | 6/2007 | Stollwerck et al. |
| 2007/0145023 A1 | 6/2007 | Holber et al. |
| 2007/0148349 A1 | 6/2007 | Fukada |
| 2007/0154838 A1 | 7/2007 | Lee |
| 2007/0163440 A1 | 7/2007 | Kim et al. |
| 2007/0169703 A1 | 7/2007 | Elliot |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0235136 A1 | 10/2007 | Enomoto et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0272154 A1 | 11/2007 | Amikura et al. |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0284044 A1 | 12/2007 | Matsumoto et al. |
| 2007/0284344 A1 | 12/2007 | Todorov et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0029032 A1 | 2/2008 | Sun et al. |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |

(56) References Cited

U.S. PATENT DOCUMENTS

| | | |
|---|---|---|
| 2008/0081483 A1 | 4/2008 | Wu |
| 2008/0085604 A1 | 4/2008 | Hoshino et al. |
| 2008/0089001 A1 | 4/2008 | Parkhe et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0141941 A1 | 6/2008 | Augustino et al. |
| 2008/0142831 A1 | 6/2008 | Su |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu et al. |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0193673 A1 | 8/2008 | Paterson et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0022633 A1 | 1/2009 | Tomosue et al. |
| 2009/0034148 A1 | 2/2009 | Lubomirsky et al. |
| 2009/0036292 A1 | 2/2009 | Sun et al. |
| 2009/0045167 A1 | 2/2009 | Maruyama |
| 2009/0061640 A1 | 3/2009 | Wong et al. |
| 2009/0072401 A1 | 3/2009 | Arnold et al. |
| 2009/0075409 A1 | 3/2009 | Ueno et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120364 A1 | 5/2009 | Suarez et al. |
| 2009/0120464 A1 | 5/2009 | Rasheed et al. |
| 2009/0120582 A1 | 5/2009 | Koshimizu et al. |
| 2009/0140738 A1 | 6/2009 | Desvaux et al. |
| 2009/0159213 A1 | 6/2009 | Bera et al. |
| 2009/0159566 A1 | 6/2009 | Brillhart et al. |
| 2009/0159588 A1 | 6/2009 | Morioka et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0212804 A1 | 8/2009 | Yamada et al. |
| 2009/0214825 A1 | 8/2009 | Sun et al. |
| 2009/0218317 A1 | 9/2009 | Belen et al. |
| 2009/0223928 A1 | 9/2009 | Colpo |
| 2009/0226633 A1 | 9/2009 | Laflamme et al. |
| 2009/0236314 A1 | 9/2009 | Chen |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0286405 A1 | 11/2009 | Okesaku et al. |
| 2009/0293809 A1 | 12/2009 | Cho et al. |
| 2009/0294898 A1 | 12/2009 | Feustel et al. |
| 2009/0298256 A1 | 12/2009 | Chen et al. |
| 2009/0302005 A1 | 12/2009 | Kool et al. |
| 2009/0314309 A1 | 12/2009 | Sankarakrishnan et al. |
| 2009/0314433 A1 | 12/2009 | Hoffman et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003406 A1 | 1/2010 | Lam et al. |
| 2010/0003824 A1 | 1/2010 | Kadkhodayan et al. |
| 2010/0006032 A1 | 1/2010 | Hinckley et al. |
| 2010/0006543 A1 | 1/2010 | Sawada et al. |
| 2010/0018648 A1 | 1/2010 | Collins et al. |
| 2010/0022030 A1 | 1/2010 | Ditizio |
| 2010/0025370 A1 | 2/2010 | Dieguez-Campo et al. |
| 2010/0037821 A1 | 2/2010 | Nogami |
| 2010/0039747 A1 | 2/2010 | Sansoni et al. |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0089533 A1 | 4/2010 | Ueda et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |

(56) References Cited

U.S. PATENT DOCUMENTS

| | | |
|---|---|---|
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0206483 A1 | 8/2010 | Sorensen et al. |
| 2010/0207195 A1 | 8/2010 | Fukuzumi et al. |
| 2010/0207205 A1 | 8/2010 | Grebs et al. |
| 2010/0212594 A1 | 8/2010 | Hara et al. |
| 2010/0213172 A1 | 8/2010 | Wilson |
| 2010/0224322 A1 | 9/2010 | Sui et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0248488 A1 | 9/2010 | Agarwal et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0317197 A1 | 12/2010 | Lind et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0042799 A1 | 2/2011 | Kang et al. |
| 2011/0043228 A1 | 2/2011 | Makhratchev et al. |
| 2011/0045676 A1 | 2/2011 | Park |
| 2011/0048325 A1 | 3/2011 | Choi et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito et al. |
| 2011/0101335 A1 | 5/2011 | Yamazaki et al. |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shih et al. |
| 2011/0147363 A1 | 6/2011 | Yap et al. |
| 2011/0151674 A1* | 6/2011 | Tang ................. H01J 37/32357 438/715 |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0223334 A1 | 9/2011 | Yudovsky et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0303146 A1 | 12/2011 | Nishijima |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0073501 A1 | 3/2012 | Lubomirsky et al. |
| 2012/0091108 A1 | 4/2012 | Lin et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |

(56) References Cited

U.S. PATENT DOCUMENTS

| | | |
|---|---|---|
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hadidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |
| 2012/0322015 A1 | 12/2012 | Kim |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023094 A1 | 1/2013 | Yeh et al. |
| 2013/0023124 A1 | 1/2013 | Nemani et al. |
| 2013/0023125 A1 | 1/2013 | Singh |
| 2013/0026135 A1 | 1/2013 | Kim |
| 2013/0032574 A1 | 2/2013 | Liu et al. |
| 2013/0034666 A1 | 2/2013 | Liang |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0059448 A1 | 3/2013 | Marakhtanov et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0095646 A1 | 4/2013 | Alsmeier et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0112383 A1 | 5/2013 | Hanamachi |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0133578 A1 | 5/2013 | Hwang |
| 2013/0149866 A1 | 6/2013 | Shriner |
| 2013/0150303 A1 | 6/2013 | Kungl et al. |
| 2013/0152859 A1 | 6/2013 | Collins et al. |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0171827 A1 | 7/2013 | Cho et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0276983 A1 | 10/2013 | Park et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0284700 A1 | 10/2013 | Nangoy et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0320550 A1 | 12/2013 | Kim |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0054269 A1 | 2/2014 | Hudson et al. |
| 2014/0057447 A1 | 2/2014 | Yang et al. |
| 2014/0061324 A1 | 3/2014 | Mohn et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0076234 A1 | 3/2014 | Kao et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0110061 A1 | 4/2014 | Okunishi |
| 2014/0124364 A1 | 5/2014 | Yoo et al. |
| 2014/0134842 A1 | 5/2014 | Zhang et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0148015 A1 | 5/2014 | Larson |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen et al. |
| 2014/0166618 A1 | 6/2014 | Tadigadapa et al. |
| 2014/0175530 A1 | 6/2014 | Chien et al. |
| 2014/0175534 A1 | 6/2014 | Kofuji et al. |
| 2014/0186772 A1 | 7/2014 | Pohlers et al. |
| 2014/0190410 A1 | 7/2014 | Kim |
| 2014/0190632 A1 | 7/2014 | Kumar et al. |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0251956 A1 | 9/2014 | Jeon et al. |
| 2014/0253900 A1 | 9/2014 | Cornelissen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264507 A1 | 9/2014 | Lee et al. |

(56) References Cited

U.S. PATENT DOCUMENTS

| | | |
|---|---|---|
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0363979 A1 | 12/2014 | Or et al. |
| 2014/0373782 A1 | 12/2014 | Park et al. |
| 2015/0007770 A1 | 1/2015 | Chandrasekharan et al. |
| 2015/0011096 A1 | 1/2015 | Chandrasekharan et al. |
| 2015/0013793 A1 | 1/2015 | Chuc et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0056814 A1 | 2/2015 | Ling et al. |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0167705 A1 | 6/2015 | Lee et al. |
| 2015/0170811 A1 | 6/2015 | Tanigawa et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0191823 A1 | 7/2015 | Banna et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214101 A1 | 7/2015 | Ren et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0240359 A1 | 8/2015 | Jdira et al. |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270105 A1 | 9/2015 | Kobayashi et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0303031 A1 | 10/2015 | Choi |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0371877 A1 | 12/2015 | Lin et al. |
| 2015/0372104 A1 | 12/2015 | Liu et al. |
| 2015/0376782 A1 | 12/2015 | Griffin et al. |
| 2015/0380419 A1 | 12/2015 | Gunji-Yoneoka et al. |
| 2015/0380431 A1 | 12/2015 | Kanamori et al. |
| 2016/0005571 A1 | 1/2016 | Rosa et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1 | 2/2016 | Cho et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0079062 A1 | 3/2016 | Zheng et al. |
| 2016/0079072 A1 | 3/2016 | Wang et al. |
| 2016/0083844 A1 | 3/2016 | Nishitani et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1* | 3/2016 | Chen ............... H01L 21/31116 438/723 |
| 2016/0093737 A1 | 3/2016 | Li et al. |
| 2016/0097119 A1 | 4/2016 | Cui et al. |
| 2016/0099173 A1 | 4/2016 | Agarwal et al. |
| 2016/0104606 A1 | 4/2016 | Park et al. |
| 2016/0104648 A1 | 4/2016 | Park et al. |
| 2016/0109863 A1 | 4/2016 | Valcore et al. |
| 2016/0111315 A1 | 4/2016 | Parkhe |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141179 A1 | 5/2016 | Wu et al. |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |

(56) References Cited

U.S. PATENT DOCUMENTS

| | | |
|---|---|---|
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0190147 A1 | 6/2016 | Kato et al. |
| 2016/0196969 A1 | 7/2016 | Berry et al. |
| 2016/0196984 A1 | 7/2016 | Lill et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0218018 A1 | 7/2016 | Liu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240353 A1 | 8/2016 | Nagami |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1 | 11/2016 | Thomas et al. |
| 2016/0343548 A1 | 11/2016 | Howald et al. |
| 2016/0358793 A1 | 12/2016 | Okumura et al. |
| 2017/0011922 A1 | 1/2017 | Tanimura et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2017/0104061 A1 | 4/2017 | Peng et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0121818 A1 | 5/2017 | Dunn et al. |
| 2017/0133202 A1 | 5/2017 | Berry |
| 2017/0169995 A1 | 6/2017 | Kim et al. |
| 2017/0178894 A1 | 6/2017 | Stone et al. |
| 2017/0178899 A1 | 6/2017 | Kabansky et al. |
| 2017/0178915 A1 | 6/2017 | Ingle et al. |
| 2017/0178924 A1 | 6/2017 | Chen et al. |
| 2017/0194128 A1 | 7/2017 | Lai et al. |
| 2017/0207088 A1 | 7/2017 | Kwon et al. |
| 2017/0221708 A1 | 8/2017 | Bergendahl et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/0236694 A1 | 8/2017 | Eason et al. |
| 2017/0250193 A1 | 8/2017 | Huo |
| 2017/0294445 A1 | 10/2017 | Son et al. |
| 2017/0306494 A1 | 10/2017 | Lin et al. |
| 2017/0309509 A1 | 10/2017 | Tran et al. |
| 2017/0316935 A1 | 11/2017 | Tan et al. |
| 2017/0338133 A1 | 11/2017 | Tan et al. |
| 2017/0338134 A1 | 11/2017 | Tan et al. |
| 2017/0350011 A1 | 12/2017 | Marquardt |
| 2017/0362704 A1 | 12/2017 | Yamashita |
| 2017/0373082 A1 | 12/2017 | Sekine et al. |
| 2018/0005850 A1 | 1/2018 | Citla et al. |
| 2018/0006050 A1 | 1/2018 | Watanabe et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0151683 A1 | 5/2018 | Yeo et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0211862 A1 | 7/2018 | Konkola et al. |
| 2018/0223437 A1 | 8/2018 | George et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |
| 2018/0337057 A1 | 11/2018 | Samir et al. |
| 2018/0366351 A1 | 12/2018 | Lubomirsky |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |

(56) References Cited

FOREIGN PATENT DOCUMENTS

| | | |
|---|---|---|
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-008278 A | 2/2000 |
| KR | 10-2000-0064946 A | 11/2000 |
| KR | 10-2001-0056735 A | 7/2001 |
| KR | 2003-0023964 A | 3/2003 |
| KR | 10-2003-0054726 A | 7/2003 |
| KR | 10-2003-0083663 A | 10/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |
| KR | 10-2008-0063988 A | 7/2008 |
| KR | 10-0843236 B1 | 7/2008 |
| KR | 10-2009-0040869 A | 4/2009 |
| KR | 10-2010-0013980 A | 2/2010 |
| KR | 10-2010-0093358 A | 8/2010 |
| KR | 10-2011-0086540 A | 7/2011 |
| KR | 10-2011-0114538 A | 10/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 2008-112673 A2 | 9/2008 |
| WO | 2009-009611 A2 | 1/2009 |
| WO | 2009-084194 A1 | 7/2009 |
| WO | 10-2009-0128913 A | 12/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A1 | 6/2011 |
| WO | 2011-095846 A1 | 8/2011 |
| WO | 2011-149638 A | 12/2011 |
| WO | 2012-050321 A | 7/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

\* cited by examiner

SELF-LIMITING SELECTIVE ETCHING SYSTEMS AND METHODS

TECHNICAL FIELD

The present technology relates to semiconductor processes and equipment. More specifically, the present technology relates to selectively etching oxygen-containing structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include flowing a hydrogen-containing precursor into a substrate processing region of a semiconductor processing chamber. The methods may include flowing a fluorine-containing precursor into the substrate processing region. The methods may include contacting a substrate housed in the substrate processing region with the hydrogen-containing precursor and the fluorine-containing precursor. The substrate may define a trench, and a layer of an oxygen-containing material may be disposed within the trench and exposed on the substrate. The methods may include halting delivery of the hydrogen-containing precursor. The methods may also include removing the oxygen-containing material.

In some embodiments, the hydrogen-containing precursor may be maintained fluidly isolated from a plasma formable within the semiconductor processing chamber in a remote plasma region of the semiconductor processing chamber. The hydrogen-containing precursor may be or include water vapor. The fluorine-containing precursor may be or include anhydrous hydrogen fluoride. The substrate may also include an exposed region of hafnium oxide, zirconium oxide, aluminum oxide, or other high-k materials including metal-containing materials. The oxygen-containing material may be selected from the group consisting of silicon dioxide, silicon oxycarbide, silicon oxynitride, or silicon oxycarbonitride.

The etching method may be performed at a temperature below or about 0° C. The etching method may be performed at a temperature above a freezing point of water at operating chamber conditions. The fluorine-containing precursor may be continually flowed subsequent halting the flow of the hydrogen-containing precursor. The fluorine-containing precursor may be flowed at a flow rate below or about 1 slm during the etching method. The fluorine-containing precursor may be pulsed during the etching method. The fluorine-containing precursor may be pulsed off for at least two seconds during each cycle of pulsing performed during the etching method. The substrate processing region may be maintained plasma free during the etching method.

Some embodiments of the present technology may also encompass removal methods, which may include flowing water vapor into a substrate processing region at a temperature below or about 0° C. The methods may include flowing a fluorine-containing precursor into the substrate processing region of a semiconductor processing chamber. The methods may include contacting a substrate housed in the substrate processing region with the water vapor and the fluorine-containing precursor. The substrate may define a trench, and a layer of an oxygen-containing material may be disposed within the trench and exposed on the substrate. The methods may include halting the flow of water vapor while maintaining the flow of the fluorine-containing precursor. The methods may also include removing the oxygen-containing material.

In some embodiments, the water vapor may be delivered into the substrate processing region at a temperature above or about −40° C. The fluorine-containing precursor may be flowed at a rate of less than or about 500 sccm during the removal method. The fluorine-containing precursor may be delivered in pulses. The delivery may be characterized by a first period of time during which the fluorine-containing precursor is flowed, and a second period of time during which the fluorine-containing precursor flow is halted. The first period of time and the second period of time may both be greater than or about 2 seconds. The fluorine-containing precursor may be anhydrous hydrogen fluoride, and the substrate processing region may be maintained plasma-free during the removal method.

Some embodiments of the present technology may also encompass etching methods. The methods may include flowing a hydrogen-containing precursor into a substrate processing region of a semiconductor processing chamber while maintaining the substrate process region at a temperature between about −50° C. and about 0° C. The methods may include flowing anhydrous hydrogen fluoride into the substrate processing region. The methods may include contacting a substrate housed in the substrate processing region with the hydrogen-containing precursor and the anhydrous hydrogen fluoride. The substrate may define a trench, and a layer of an oxygen-containing material may be disposed within the trench and exposed on the substrate. The methods may include halting the flow of the hydrogen-containing precursor. The methods may include removing the oxygen-containing material.

Such technology may provide numerous benefits over conventional systems and techniques. For example, the processes may allow high-aspect-ratio features to be etched without eroding other exposed materials. Additionally, the processes may produce a self-limiting etch, where etching ceases once the desired material has been fully removed.

These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
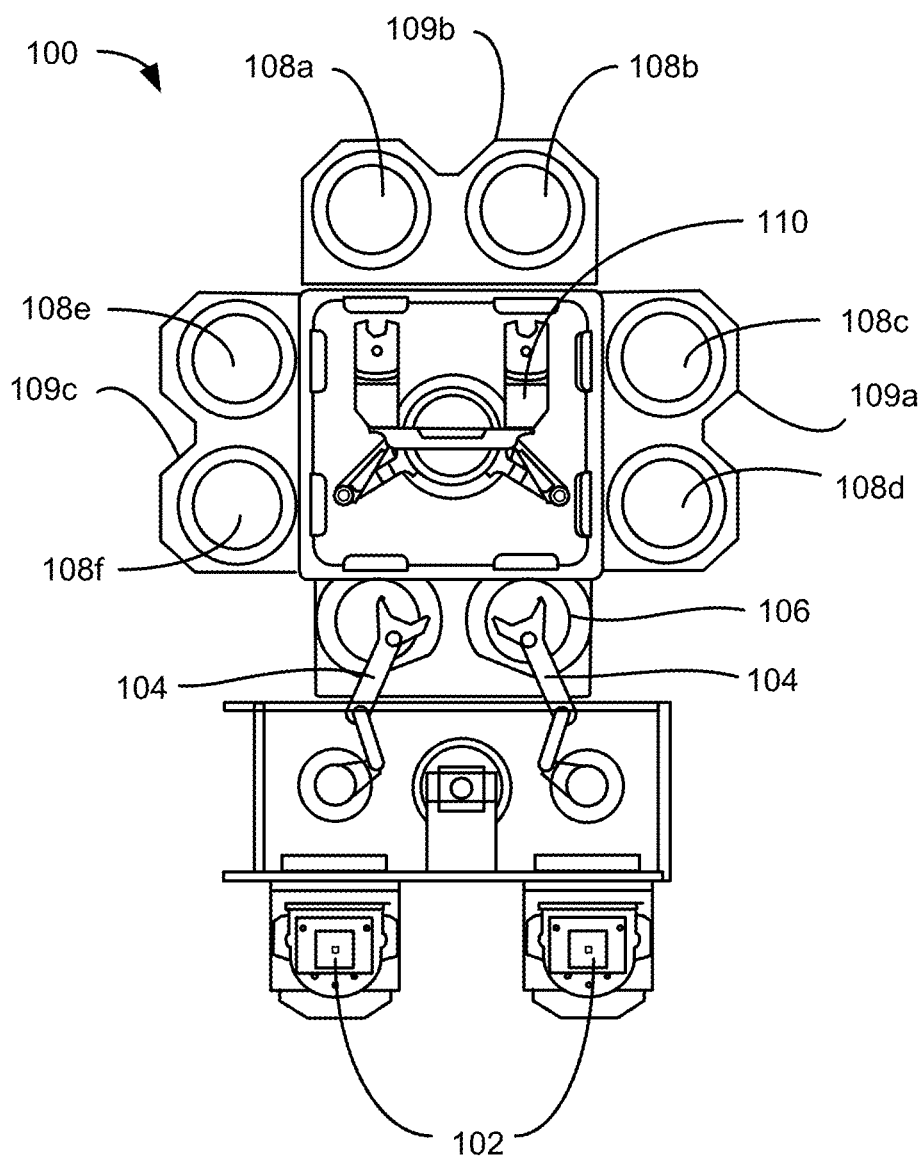
FIG. 1 shows a top plan view of one embodiment of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Diluted acids may be used in many different semiconductor processes for cleaning substrates and removing materials from those substrates. For example, diluted hydrofluoric acid can be an effective etchant for silicon oxide, and may be used to remove silicon oxide from silicon surfaces. After the etching or cleaning operation is complete, the acid may be dried from the wafer or substrate surface. Using dilute hydrofluoric acid ("DHF") may be termed a "wet" etch, and the diluent is often water. Additional etching processes may be used that utilize precursors delivered to the substrate. For example, a plasma species may be delivered to a wafer along with water vapor to form an etchant mixture as well.

Although wet etchants using aqueous solutions or water-based processes may operate effectively for certain substrate structures, the water may pose issues in a variety of conditions. For example, in some oxide etch processes, including silicon dioxide as one non-limiting example, utilizing water, as well as conditions at which the etch process is performed, may create etch processes that may not be well controlled. Again with the non-limiting example of etching silicon dioxide, etchants may include a fluorine-containing precursor as well as a hydrogen-containing precursor. In one example, the fluorine-containing precursor may be anhydrous hydrogen fluoride, and the hydrogen-containing precursor may be water. The chemical process occurring may include the following reaction:

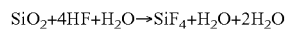

$$SiO_2 + 4HF + H_2O \rightarrow SiF_4 + H_2O + 2H_2O$$

As illustrated, along with the formation of volatile silicon tetrafluoride, the etch reaction may produce additional water as well. As hydrogen fluoride continues to be flowed, the etch process may proceed faster due to the increasing amount of water being produced at the etch front to form etchant with the hydrogen fluoride. Although the oxide may be removed, control of the removal may be difficult, and the etch process may essentially create a runaway scenario in which as long as the fluorine-containing precursor is flowed, the etch process will self-sustain and increase in speed. Conventional techniques tend to continue to flow water into the processing chamber, or maintain an amount of relative humidity that delivers even more water, producing a further lack of control on the reaction process.

Utilizing water during etch processes may also pose issues when utilized on substrates including metal materials. For example, certain later fabrication processes, such as producing air gaps, removing oxide dielectric, or other processes to remove oxygen-containing materials, may be performed after an amount of metallization has been formed on a substrate. If water is utilized in some fashion during the etching, an electrolyte may be produced, which when contacting the metal material, may cause galvanic corrosion to occur between dissimilar metals, and the metal may be corroded or displaced in various processes. Although some conventional processes have avoided this issue by utilizing alternative precursors, they may be unsuitable for fabrication processes in which multiple exposed materials are located, which may include silicon oxide, silicon nitride, as well as exposed metal.

Hafnium oxides have become prevalent in many semiconductor structures as well, along with other high-k materials including zirconium oxide, aluminum oxide, and other high-k materials and metal-containing materials, and water may affect hafnium oxide layers formed around features, such as metal gates. Hafnium oxide may be characterized by a more porous structure which may absorb fluorine containing precursors. When water is introduced to these structures, a hydroxide of hafnium may be produced, which may exhibit flowability and swelling, and discreet hafnium oxide structures may be partially or fully displaced or otherwise damaged by these etching methods.

The present technology overcomes these issues by performing a self-limiting and self-catalyzed etch process that allows removal of material through high aspect ratio features, as well as removal of oxide relative to a host of other materials. The processes may or may not utilize plasma effluents as part of the etchant recipes in different embodiments. The technology may be capable of selectively etching oxide-containing materials relative to carbon-containing or nitrogen-containing materials. Additionally, based on the control of the etch process, exposed carbon-containing or nitrogen-containing materials may be protected during the etching of what may conventionally otherwise be lower-selectivity etches. In embodiments in which a plasma may not be formed, formation of oxygen and hydroxyl radicals may be minimized, which may further protect surrounding structures. Finally, by utilizing a minimum amount of water to catalyze oxide removal, the etch chemistry may operate essentially on oxide surfaces alone. This may reduce effects on exposed regions of metal materials including hafnium dioxide, where additional spacer layers may further protect the structure along sidewalls through the substrate. Accordingly, damage and displacement of hafnium and other metal structures may be minimized or substantially prevented. Indeed, aspects of the present technology may passivate hafnium oxide and other materials from etching based on the etchant materials used.

Although the remaining disclosure will routinely identify specific etching processes utilizing the disclosed technology, it will be readily understood that the systems and methods are equally applicable to deposition and cleaning processes as may occur in the described chambers, as well as other etching technology including back-end-of-line air gap formation and other etching that may be performed with a variety of exposed materials that may be maintained or substantially maintained. Accordingly, the technology should not be considered to be so limited as for use with the exemplary etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
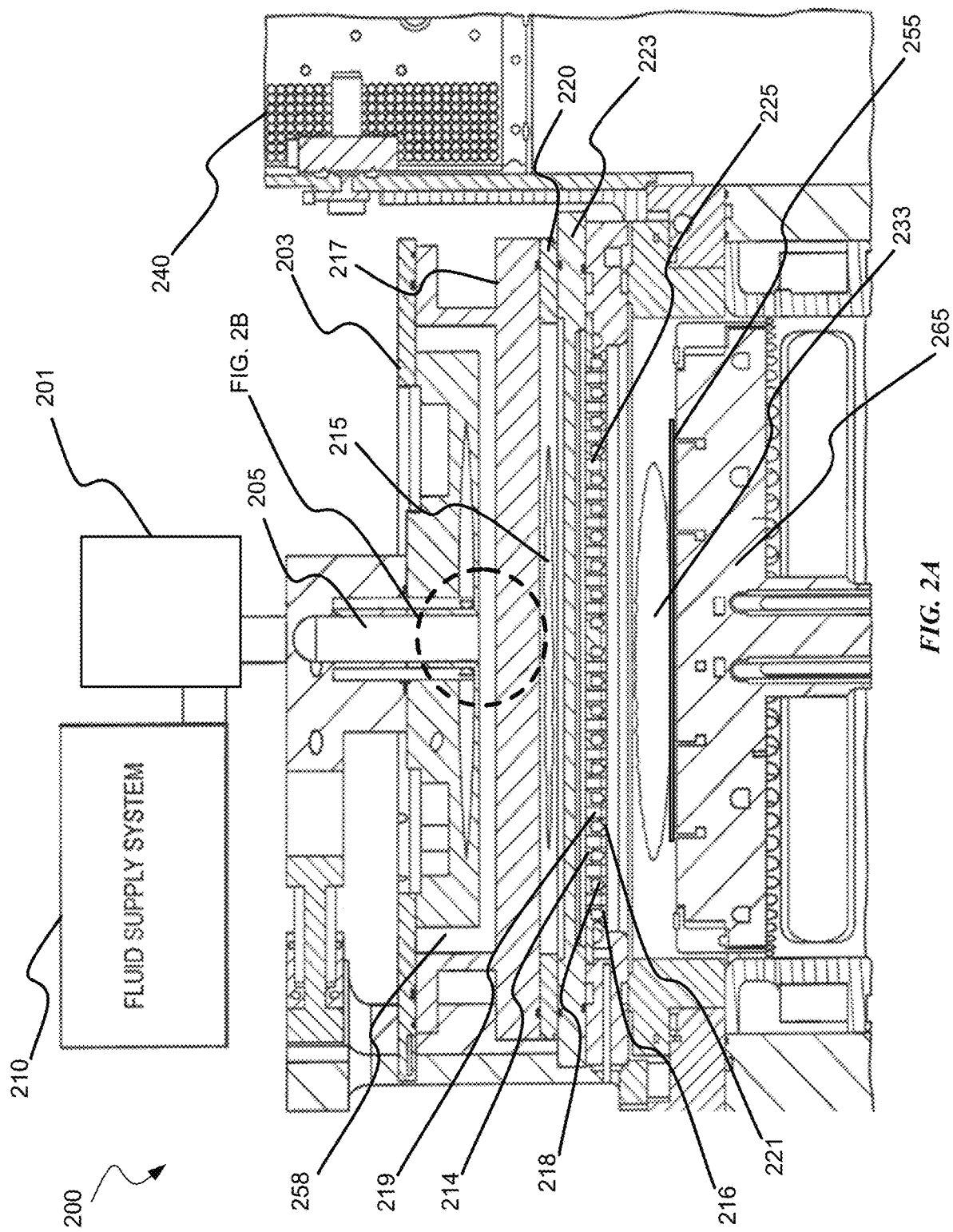
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
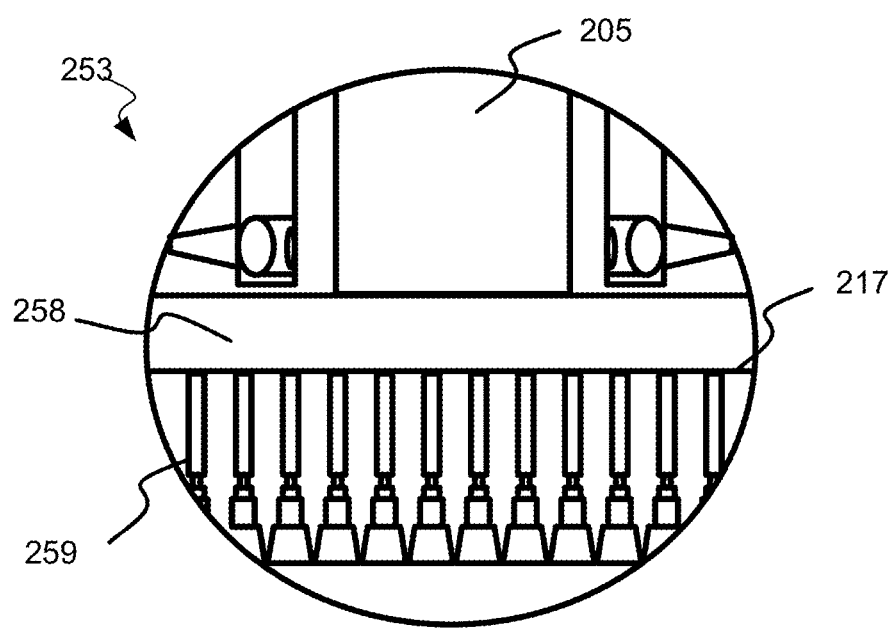
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
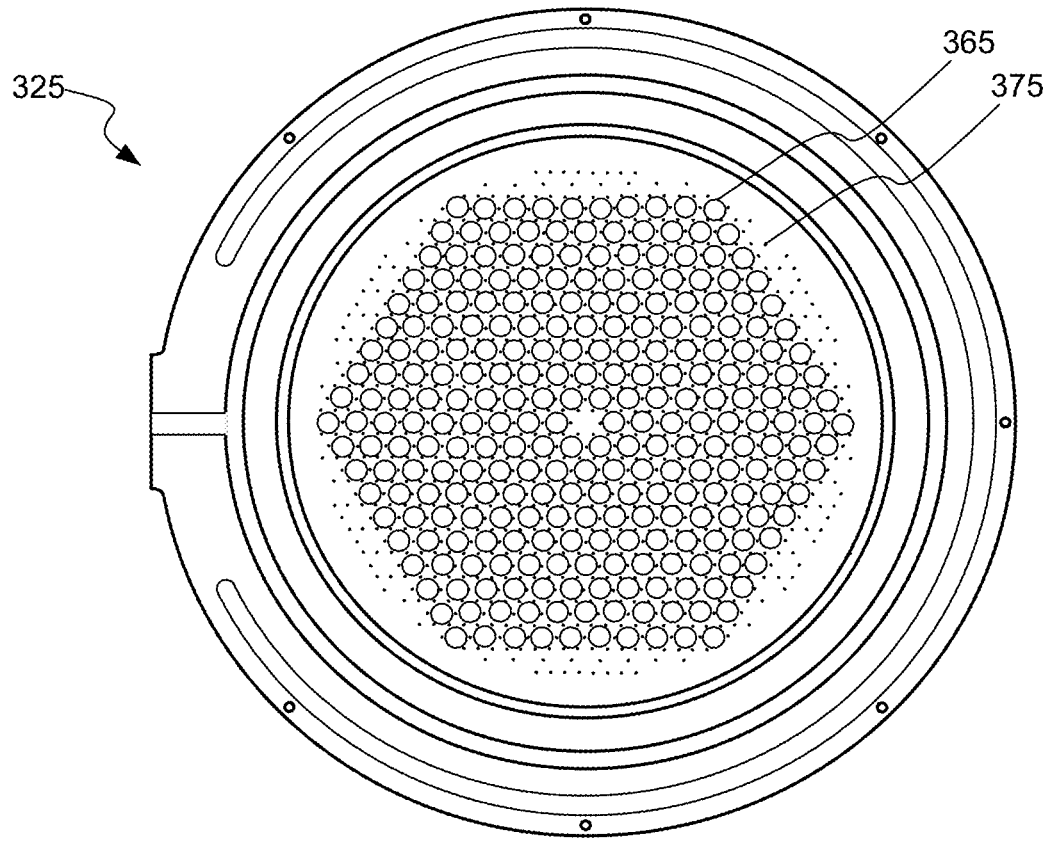
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
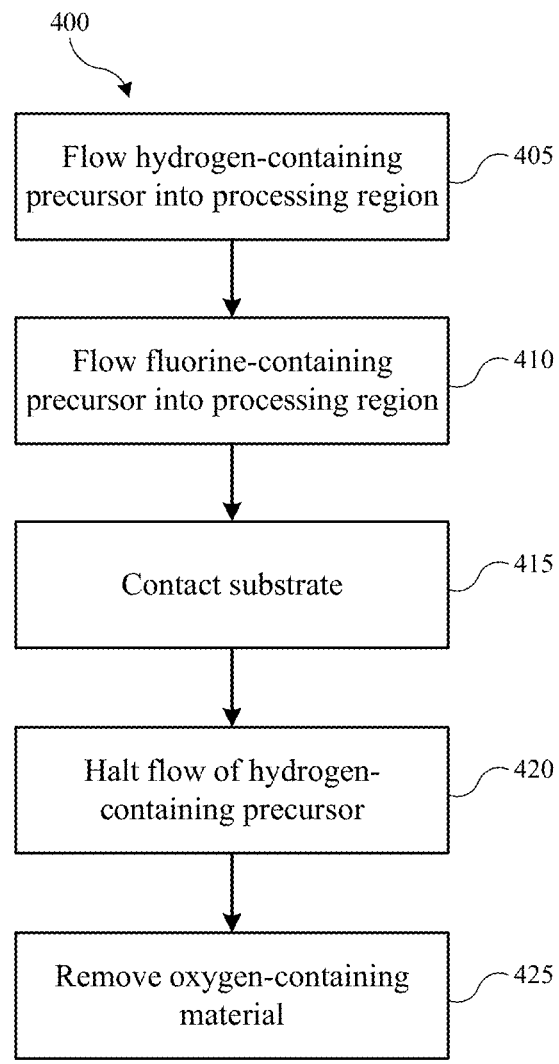
FIG. 4 shows exemplary operations in a method according to embodiments of the present technology.
Figure 5A:
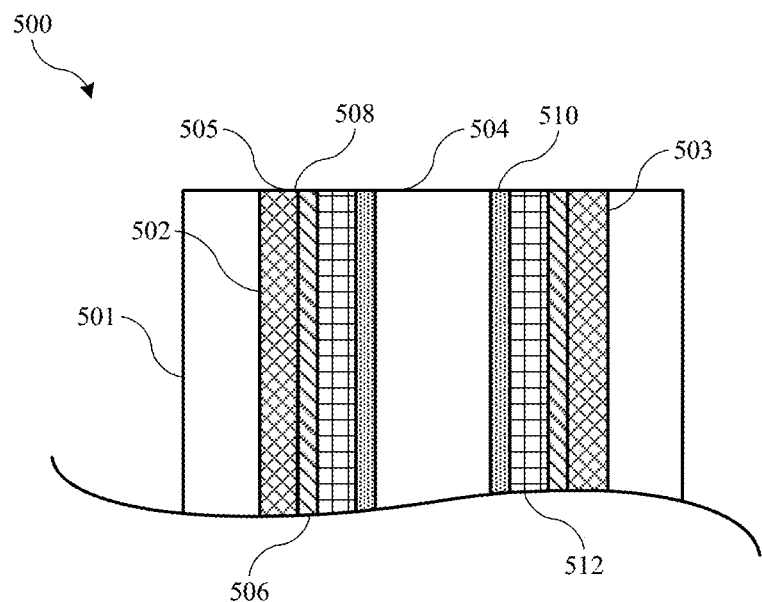
FIGS. 5A-5C show cross-sectional views of substrates being processed according to embodiments of the present technology.
Figure 5B:
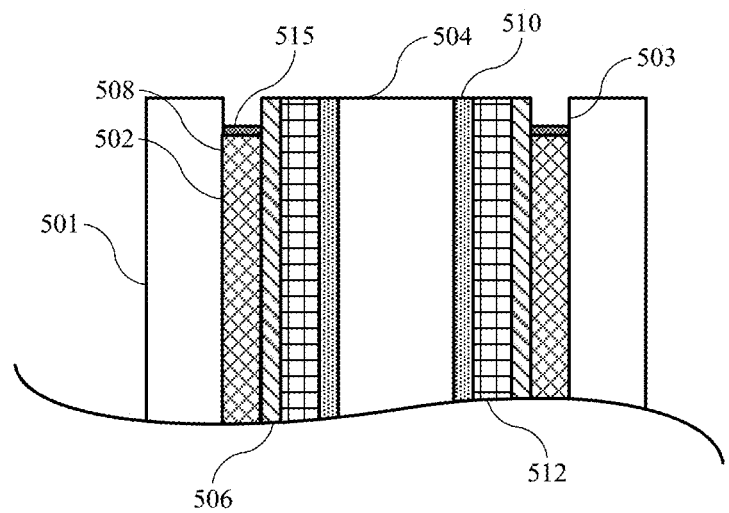
Figure 5C:
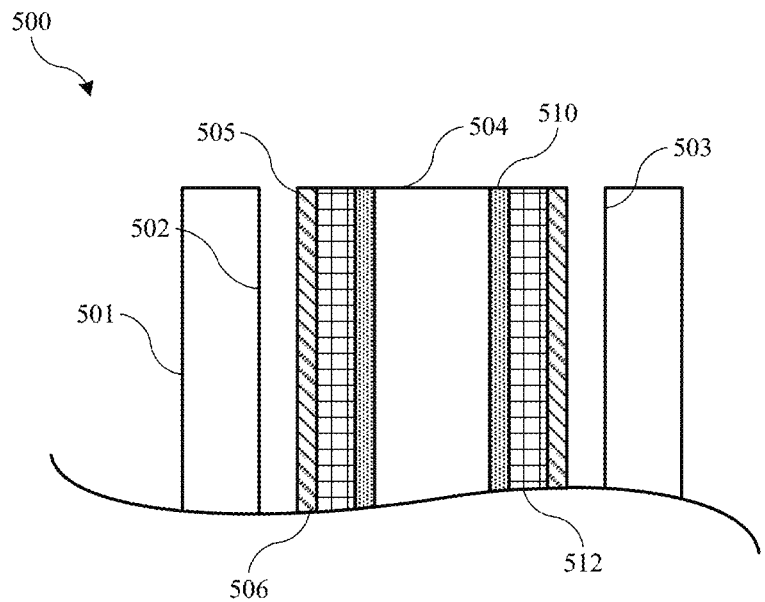

The chamber discussed previously may be used in performing exemplary methods including etching methods. Turning to FIG. 4 is shown exemplary operations in a method 400 according to embodiments of the present technology. Method 400 may include one or more operations prior to the initiation of the method, including front end processing, deposition, gate formation, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 400 describes operations shown schematically in FIGS. 5A-5C, the illustrations of which will be described in conjunction with the operations of method 400. It is to be understood that FIG. 5 illustrates only partial schematic views, and a substrate may contain any number of structural sections having aspects as illustrated in the figures, as well as alternative structural aspects that may still benefit from operations of the present technology Method 400 may or may not involve optional operations to develop the semiconductor structure to a particular fabrication operation. It is to be understood that method 400 may be performed on any number of semiconductor structures, and FIG. 5 illustrates one exemplary structure of a gate about which an oxide removal operation may be performed. As illustrated in FIG. 5A, the semiconductor structure may represent a device in which a trench, via, or other recessed feature has been formed in a substrate 501. As illustrated, structure 500 may include a substrate 501 made of or containing silicon or some other semiconductor substrate material as well as interlayer dielectric materials through which a recess, trench, via, or isolation structure may be formed. Trench 503, which may also be a via or other recess that is similarly encompassed by the present technology, may include a spacer 505 structure formed between a sidewall 502 of substrate 501 and a material 504 formed or positioned within trench 503. Material 504 may be a metal material such as a gate, a dielectric material, a contact material, a transistor material, or any other material that may be used in semiconductor processes.

It is to be understood that the figure is merely indicative of one of many structures for which the present technology may be applicable. Other exemplary structures may include two-dimensional and three-dimensional structures common in semiconductor manufacturing, and within which an oxide material is to be removed relative to one or more other materials, as the present technology may selectively remove many oxide containing materials, such as silicon oxide, relative to materials having a reduced oxygen content, such as silicon, silicon nitride, and any of the other materials discussed elsewhere. Additionally, although a high-aspect-ratio structure is illustrated and discussed, the technology may be equally applicable to lower aspect ratios and any other structures. Returning to the figure, gate metals and materials may include a number of metal and/or metal-containing species including tungsten, titanium, tantalum, cobalt, aluminum, or any other work-function metal or material which may be incorporated within the structure. About gate or material 504 may be a liner 510 as well as a layer of hafnium oxide 512, which may operate as an additional gate insulator, for example.

Spacer 505 may include a number of layers formed laterally adjacent one another. For example, as illustrated in the figure, spacer 505 may include a first layer 506, and a second layer 508. In some alternative embodiments, second layer 508 may be a different sacrificial layer, or a portion of an interlayer dielectric to be removed. The spacer 505 may include any number of layers in different embodiments, although in some embodiments the spacer may include at least two layers of materials. Some methods of forming an airgap, such as in some embodiments of the present technology, may include forming a sacrificial layer between other layers of the spacer. During subsequent removal, the sacrificial layer may be removed to provide the airgap between the maintained layers of the spacer. In some embodiments, second layer 508 of spacer 505 may illustrate a sacrificial material to be removed from the substrate to produce an airgap between the first layer 506 and a third layer of the spacer 505, not shown.

In some embodiments, although not illustrated, first layer 506 of spacer 505 and second layer 508 of spacer 505 may extend beneath a third layer by some amount as would be understood by one of skill for a finFET structure in which the spacer materials may extend about a fin and source/drain structure formed perpendicular to the illustrated gate. As these layers may be formed over one another during fabrication, the last layer formed, such as a third layer laterally out from second layer 508 may be seated or disposed over the other layers of the spacer 505. In some embodiments, a lateral portion of the sacrificial spacer material may be removed during a self-catalyzing etching operation as will be discussed further below.

It is to be understood that the illustration includes only a schematic view of a spacer according to some embodiments of the present technology, and is not drawn to any particular scale, but is instead illustrated to emphasize certain characteristics of possible structures encompassed by the present technology having an oxide material to be removed. For example, in some embodiments each layer may be formed to a similar thickness laterally, or any individual layer may be thicker than any other layer, or may not be included. Similarly, additional layers of material may be included in a variety of configurations as well. Layers of material according to the present technology may be characterized by any aspect ratios or the height-to-width ratio of the structure, although in some embodiments the materials may be characterized by larger aspect ratios, which may not allow sufficient etching utilizing conventional technology or methodology. For example, in some embodiments the aspect ratio of any layer of an exemplary structure may be greater than or about 10:1, greater than or about 20:1, greater than or about 30:1, greater than or about 40:1, greater than or about 50:1, or greater. Additionally, each layer of spacer 505 may be characterized by a reduced width less than or about 10 nm, less than or about 8 nm, less than or about 6 nm, less than or about 5 nm, less than or about 4 nm, less than or about 3 nm, less than or about 2 nm, less than or about 1 nm, or less, including any fraction of any of the stated numbers, such as 2.5 nm, 1.5 nm, etc. This combination of high aspect ratios and minimal widths may frustrate many conventional etching operations, or require substantially longer etch times to remove a layer, such as layer 508, along a vertical distance through a confined width. Moreover, damage to or removal of other exposed layers may occur with conventional technologies as well.

The materials encompassed by the present technology may include a variety of materials, such as silicon-containing materials, for each of the spacer layers. As previously discussed, substrate 501 may include materials including silicon or polysilicon, silicon germanium, or other materials, including silicon oxide or other dielectric materials when the structure represents material formed overlying a substrate, such as an interlayer dielectric, for example. Although not illustrated, one or more capping materials may be formed over the exposed upper surface of substrate 501 or material 504, and may include oxide and/or nitride materials, or any of the other materials noted here. Spacer 505 may be characterized by multiple layers, each layer of which may be any number of materials. For example, any of the layers may be or include silicon oxide, silicon oxycarbide, silicon oxycarbonitride, silicon carbon nitride, or silicon nitride. In some embodiments adjacent layers of spacer 505 may be different materials. For example, second spacer layer 508 may be a different material from first spacer layer 506.

In some embodiments, first spacer layer 506 may be or include a carbon-containing and/or nitrogen-containing material, such as any of the nitride-containing materials noted above, and second spacer layer 508 may be or include an oxygen-containing material, such as any of the oxygen-containing materials noted above. For example, one possible combination of materials may include silicon carbon nitride for the first spacer layer 506, and silicon oxide, silicon oxycarbide, or silicon oxycarbonitride as the second spacer layer 508. Put another way, in some embodiments, second spacer layer 508 may include a higher oxygen concentration, or a lower carbon concentration, or a lower nitrogen concentration, than first spacer layer 506. As will be explained below, such configurations may advantageously allow selective removal of the second spacer layer 508, while substantially or essentially maintaining the first spacer layer and any number of exposed gate or other metal materials of the substrate.

The method 400 may be performed to remove second spacer layer 508 in embodiments, although any number of oxide or oxygen-containing materials may be removed in any number of structures in embodiments of the present technology. The method may include flowing a hydrogen-containing precursor into the substrate processing region of a semiconductor processing chamber housing the described substrate, or some other substrate, at operation 405. Method 400 may further include flowing a fluorine-containing precursor into the substrate processing region at operation 410. The fluorine-containing precursor may be flowed through a remote plasma region of the processing chamber, such as region 215 described above, although in some embodiments method 400 may not utilize plasma effluents. For example, method 400 may flow a fluorine-containing or other halogen-containing precursor to the substrate without exposing the precursor to a plasma.

The hydrogen-containing precursor may be flowed into the processing region prior to the fluorine-containing precursor, although in some embodiments the precursors may be co-flowed, and the two precursors may be flowed through different or similar portions of the processing chamber. For example, both precursors may be flowed through an entrance to the chamber, or the fluorine-containing precursor may be flowed through a first access to the chamber, and the hydrogen-containing precursor may be flowed through a second access to the chamber. At operation 415, the hydrogen-containing precursor and the fluorine-containing precursor may contact a semiconductor substrate including an oxygen-containing material, such as is illustrated in FIG. 5. The flow of the hydrogen-containing precursor may be halted at operation 420, which will be described further below, and may limit a runaway effect in the etching process, allowing a self-limiting etch process to occur. At operation 425 at least a portion of the second spacer 508, which may be or include an oxygen-containing material, may be removed while maintaining additional layers of spacer 505, such as first layer 506, as well as additionally exposed metals or metal-containing materials, which may include any of the previously noted materials.

Precursors used in the method may include a fluorine-containing precursor or a halogen-containing precursor. An exemplary fluorine-containing precursor may be nitrogen trifluoride ($NF_3$), which may be flowed into the remote plasma region, which may be separate from, but fluidly coupled with, the processing region. Other sources of fluorine may be used in conjunction with or as replacements for the nitrogen trifluoride. In general, a fluorine-containing precursor may be flowed into the remote plasma region and the fluorine-containing precursor may include at least one precursor selected from the group of atomic fluorine, diatomic fluorine, nitrogen trifluoride, carbon tetrafluoride, hydrogen fluoride including anhydrous hydrogen fluoride, xenon difluoride, and various other fluorine-containing precursors used or useful in semiconductor processing. The precursors may also include any number of carrier gases, which may include nitrogen, helium, argon, or other noble, inert, or useful precursors. Although a plasma may be formed in the process, in some embodiments the fluorine-containing precursor may not be plasma enhanced or radicalized prior to being delivered to the substrate processing region, and in some embodiments no plasma may be formed in exemplary processes. For example, a fluorine-containing precursor, such as anhydrous hydrogen fluoride or any other precursor, may be flowed into the semiconductor processing region without being plasma enhanced prior to contacting the substrate.

The hydrogen-containing precursor may include hydrogen, a hydrocarbon, water vapor, an alcohol, such as isopropyl alcohol, hydrogen peroxide, or other materials that may include hydrogen or a hydroxy moiety as would be understood by the skilled artisan. Additional precursors such as carrier gases or inert materials may be included with the hydrogen-containing precursors as well. In some embodiments, the hydrogen-containing precursor, such as water vapor, may be maintained fluidly isolated from a plasma that may be formed within the remote plasma region. In some embodiments, no plasma may be formed during the etching methods to aid in protecting carbon-containing or nitrogen-containing materials, such as the spacer layers surrounding the sacrificial layer. Although selectivity of a plasma process may etch oxide materials faster than nitride materials, because of the high aspect ratios and relatively thin material widths described above, exposure of sidewalls of first spacer layer 506 to an etchant including water vapor or a hydroxy-containing material may cause thinning to occur during the removal, which may not maintain sufficient thickness of the spacer layer, and may produce adverse effects on exposed metal materials as previously described. In embodiments, the plasma processing region may be maintained plasma free during the removal operations. By plasma free is meant that plasma may not be actively formed within the processing region during the operations, although plasma effluents produced remotely as described earlier, may be used during the operations.

The process of method 400 may include timing aspects as well as temperature and pressure considerations providing an etchant that may be limited in volume at initiation. For example, although a variety of hydrogen-containing or hydroxy-containing materials may be used, in some embodiments water may be flowed into the processing chamber, and may be flowed in a vapor form. The processing chamber may be operated at a temperature and pressure configured to condense a minimum amount of liquid water across a top surface of the substrate including a top surface of each of the spacer layers, which may be exposed. The water provided may be halted after a sufficient amount of water has been produced on the exposed surface of the oxide materials. Advantageously, halting the flow of water may also reduce the development of hexafluorosilicic acid where silicon tetrafluoride may be further developed with additional water and fluorine-containing precursor. This acid may stain and otherwise damage structures, yet when the amount of water is limited according to the present technology, development of the acid may be limited.

As the fluorine-containing precursor is delivered, an etch process may be performed according to the reaction described above. Although other layers may have an exposed surface that causes slight etching to occur, such as for a few monolayers, because the water flow has been stopped, as long as the exposed material is not naturally etched by the fluorine-containing precursor by itself, no further etching may occur. Conversely, because etching of the oxide may produce additional water, the oxide material may continue to etch. As this water is formed substantially or only at the etch front, the etch process may be essentially limited to the oxide material. As illustrated in FIG. 5B, self-generating water layer 515 may be formed across only the exposed oxide surface at the etch front where additional water is produced. Although the fluorine-containing precursor flow may be continued, because other exposed surfaces may not be exposed to additional water, less a discreet amount from initiation desorbed from surfaces as the oxide etch process continues, these materials may be substantially maintained, and may not be etched at all in some embodiments after the initial water delivered has been consumed. The fluorine-containing precursor may then continue the oxide etch reaction producing additional water to maintain etching at the exposed oxide surface, and as illustrated the oxide material may be continually removed with only a continued flow of the fluorine-containing precursor into the chamber.

To produce the etchant according to some embodiments, the hydrogen-containing precursor may be flowed in an initial pulse or burst to initiate the process, and in some embodiments no additional hydrogen-containing precursor may be delivered to the processing chamber. The hydrogen-containing precursor, such as water or any of the previously noted materials may be co-flowed with the delivery of the fluorine-containing precursor, or the hydrogen-containing precursor may be delivered prior to flowing the fluorine-containing precursor. For example, the hydrogen-containing material may be flowed for at least about 2 seconds prior to halting the flow of the hydrogen-containing precursor. Because a temperature gradient may form in certain chambers, such as where sidewalls may be warmer than a central region, in some embodiments the hydrogen-containing precursor may be flowed for greater than or about 3 seconds, greater than or about 4 seconds, greater than or about 5 seconds, greater than or about 6 seconds, greater than or about 7 seconds, greater than or about 8 seconds, greater than or about 9 seconds, greater than or about 10 seconds, greater than or about 20 seconds, greater than or about 30 seconds, greater than or about 45 seconds, greater than or about 1 minute, or more. To limit the amount of condensation formation on exposed surfaces, which may affect the rate of etching as well as the amount of etching of other exposed materials, in some embodiments the first period of time during which only the hydrogen-containing precursor may be flowed may be less than or about 1 minute, and may be less than or about 45 seconds, less than or about 30 seconds, less than or about 20 seconds, less than or about 10 seconds, or less.

The fluorine-containing precursor may be introduced subsequent the delivery of the hydrogen-containing precursor, although in some embodiments the precursors may be co-flowed. The fluorine-containing precursor may be flowed for a period of time to maintain the reaction, and may be continually flowed until all oxide material has been removed, or until a desired amount of the oxide material has been removed. As will be explained further below, delivery of the fluorine-containing precursor may be utilized to tune the etch process to ensure a more linear process, which may be less susceptible to runaway conditions. Accordingly, in addition to controlling the flow rate of the fluorine-containing precursor, the fluorine-containing precursor may be delivered at intervals in a pulsed delivery of material. Accordingly, the fluorine-containing precursor may be delivered for any amount of time to continue an oxide etch process, or the fluorine-containing precursor may be pulsed on for a first period of time, and may be pulsed off for a second period of time during which the flow of the fluorine-containing precursor is halted.

In some embodiments the pulse on period and the pulse off period may be a similar amount of time, although in some embodiments the times may differ, and either the pulse on period or the pulse off period may be longer. Because the etch process may be limited to oxide or oxygen-containing materials once catalyzed, in some embodiments, either with pulsed or continuous flow of the fluorine-containing precursor, the etch process may continue until all oxide material has been removed as illustrated in FIG. 5C. The etch process may naturally cease at this point, as no further water generation may occur at the etch front. Alternatively, after a desired amount of material has been removed, the flow or pulsing of fluorine-containing precursor may be halted, which may cause the etch process to cease.

Process conditions may also impact the operations performed in method 400 as well as other removal methods according to the present technology, and may afford a more controlled self-generating reaction. As previously explained, aspects of the present etch technology relate to utilizing a self-catalyzing and self-sustaining reaction in which additional water may be produced during the etch process to facilitate continued etching. However, because the amount of water may continue to increase as the reaction proceeds, a runaway reaction may occur in which sufficient water is produced to begin attacking other structures. In this scenario, water may begin to pool across the surface of the substrate after sufficient generation, which may lead to corrosion and etching of other structures. Conversely, when properly controlled, the amount of water may be contained as illustrated with etch front fluid or water layer 515, where the water generation is generally contained within the feature being etched. Hence, by maintaining a more linear or tailing etch rate, the etch process may be limited to the oxide features.

Figure 6A:
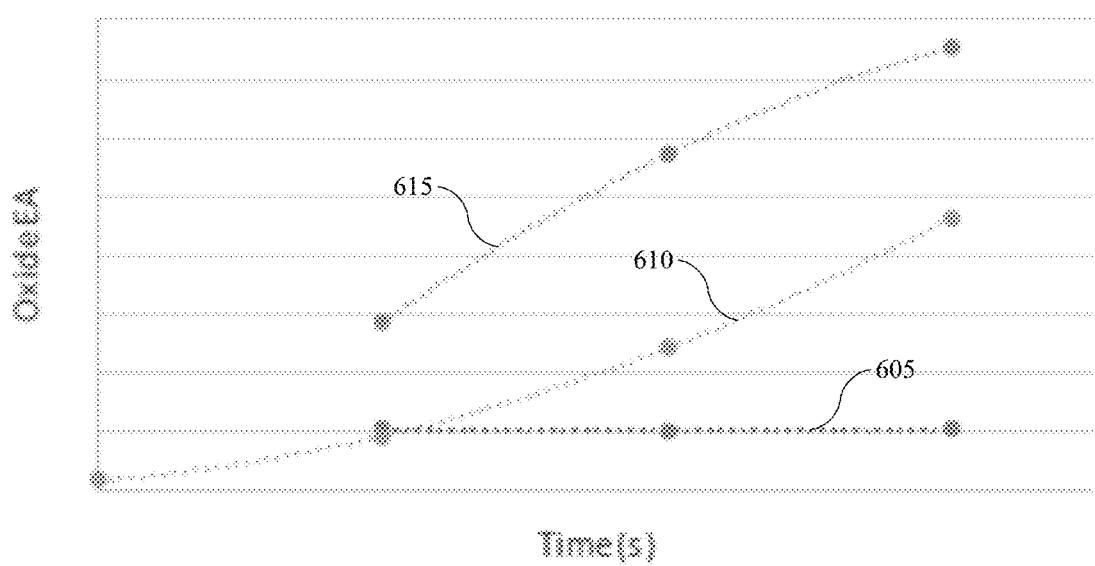
FIGS. 6A-6B show operational effects on etching according to embodiments of the present technology.

Turning to FIG. 6A is shown a chart illustrating the effect of temperature on oxide etch amount for some embodiments of the present technology. Because the etch reaction may proceed based on water retention at the surface of the oxide material, lower temperatures may facilitate maintenance and adsorption of generated water at the surface of the feature to be etched. Line 605 illustrates an etch rate where the temperature may be maintained at 0° C. or above. As illustrated, after an initial amount of etching occurs, the etch process halts completely and no further etching occurs. This may be due to the generated water desorbing from the oxide surface. Thus, despite continued delivery of a fluorine-containing precursor, without water present no further etching may occur. Accordingly, in some embodiments the temperature may be maintained below or about 0° C., and the substrate, pedestal, or chamber temperature during the method 400 may be maintained below or about −2° C., below or about −4° C., below or about −6° C., below or about −8° C., below or about −10° C., below or about −15° C., below or about −20° C., below or about −25° C., below or about −30° C., below or about −40° C., below or about −50° C., or lower. The temperature may also be maintained at any temperature within these ranges, within smaller ranges encompassed by these ranges, or between any of these ranges.

Line 610 illustrates an effect as temperature continues to be reduced. The lower the temperature, the more water may be retained at the surface of the oxide layer, and the more likely a runaway etch process may occur as illustrated by the line. As time proceeds, water is continually generated at a higher rate, and thus the etch rate begins to slope and curve upward. Beyond the edge of the chart, etch rate will continue to escalate, which may cause fluid to pool in a runaway reaction, which may damage other exposed structures. This may occur more so in exemplary processes where the water is allowed to freeze, which may further increase the amount of water retained at the surface, and thus in some embodiments the temperature may be maintained above the freezing point of water at the operating chamber conditions. Accordingly, in some embodiments the temperature may be maintained above or about −100° C. during the etch process, and may be maintained above or about −90° C., above or about −80° C., above or about −70° C., above or about −60° C., above or about −50° C., above or about −40° C., above or about −30° C., above or about −20° C., or higher, as well as within any smaller range incorporated within any of these ranges, as well as within any ranges encompassed by end points defined by and of these stated temperatures with a stated temperature in the ranges above.

Consequently, maintaining the temperate in a range to allow partial retention of water on the surface, while permitting an amount of desorption, may produce a line similar to line 615. As illustrated, the etch process actually plateaus over time, which illustrates that the process is more controlled, and may eventually quench due to full desorption of produced water. By increasing the temperature slightly, a linear etch profile may be produced by which a controlled reaction limited to the oxide material may be maintained.

The pressure within the chamber may also affect the operations performed as well as affect at what temperature the hydrogen-containing precursor may freeze or maintain a particular amount of desorption, and in embodiments the chamber pressure may be maintained below about 500 Torr, below about 400 Torr, below about 300 Torr, below about 200 Torr, below about 100 Torr, below about 50 Torr, below or about 40 Torr, below or about 30 Torr, below or about 25 Torr, below or about 20 Tor below or about 15 Torr, below or about 10 Torr, below or about 9 Torr, below or about 8 Torr, below or about 7 Torr, below or about 6 Torr, below or about 5 Torr, below or about 4 Torr, below or about 3 Torr, below or about 2 Torr, below or about 1 Torr, or less. The pressure may also be maintained at any pressure within these ranges, within smaller ranges encompassed by these ranges, or between any of these ranges. By performing the operations at pressures below about 30 Torr, the selectivity of the process with respect to a carbon-containing or nitrogen-containing material may be increased. Additionally, pressure may influence the freezing point of water and the desorption rate of water developed at the surface, and thus controlling pressure may further control the etch reaction.

Figure 6B:
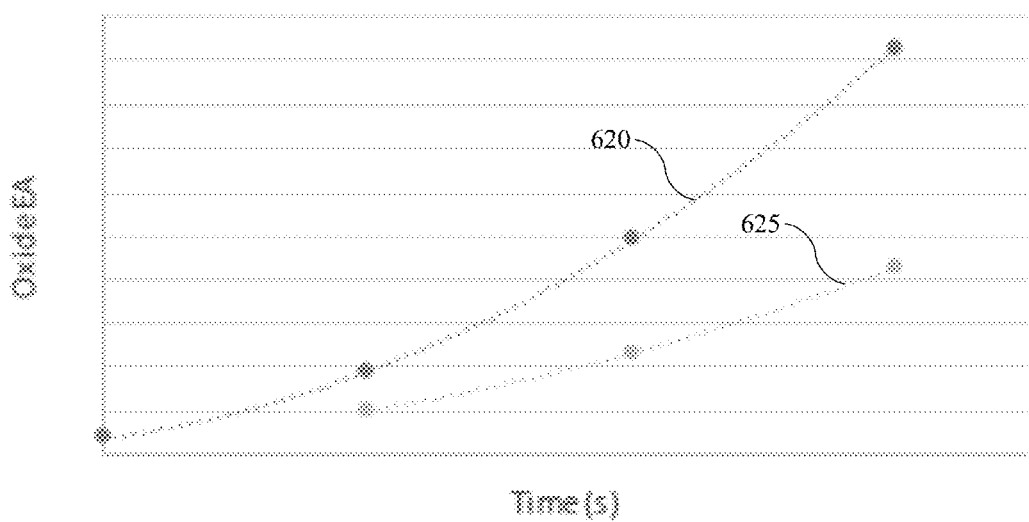

Some embodiments of the present technology involve providing an initial amount of water to initiate a reaction in which additional water is generated. Because the water flow is halted, the water flow may not be available to further tune the etch process. However, as the fluorine-containing precursor is flowed, the rate and timing may be controlled to improve control of the etch process being performed. FIG. 6B illustrates the effect of the fluorine-containing precursor flow rate on the linearity of the etch process, and may illustrate the rate for exemplary precursor anhydrous hydrogen fluoride. Line 620 illustrates a flow rate that may cause runaway etching, which may increase development of water that may damage other surfaces. Line 625 shows the effect as the flow rate of the fluorine-containing precursor is reduced, providing a more linear etch process, which may limit formation of water to the oxide material being etched.

Accordingly, the flow rate of the fluorine-containing precursor may be tuned, including in situ, to control the etch process. For example, a flow rate of the fluorine-containing precursor may be reduced, maintained, or increased during the removal operations. During any of the operations of method 400, the flow rate of the fluorine-containing precursor may be between about 5 sccm and about 1,000 sccm. Additionally, the flow rate of the fluorine-containing precursor may be maintained below or about 900 sccm, below or about 800 sccm, below or about 700 sccm, below or about 600 sccm, below or about 500 sccm, below or about 400 sccm, below or about 300 sccm, below or about 200 sccm, below or about 100 sccm, or less. The flow rate may also be between any of these stated flow rates, or within smaller ranges encompassed by any of these numbers.

Adding further control to the etch front and water development, the fluorine-containing precursor may be pulsed in some embodiments, and may be delivered throughout the etch process either continually or in a series of pulses, which may be consistent or varying over time. The pulsed delivery may be characterized by a first period of time during which the fluorine-containing precursor is flowed, and a second period of time during which the fluorine-containing precursor is paused or halted. The time periods may be similar or different from one another with either time period being longer. In embodiments either period of time may be greater than or about 1 second, and may be greater than or about 2 seconds, greater than or about 3 seconds, greater than or about 4 seconds, greater than or about 5 seconds, greater than or about 6 seconds, greater than or about 7 seconds, greater than or about 8 seconds, greater than or about 9 seconds, greater than or about 10 seconds, greater than or about 11 seconds, greater than or about 12 seconds, greater than or about 13 seconds, greater than or about 14 seconds, greater than or about 15 seconds, greater than or about 20 seconds, greater than or about 30 seconds, greater than or about 45 seconds, greater than or about 60 seconds, or longer. The times may also be any smaller range encompassed by any of these ranges.

The hydrogen-containing precursor may be flowed at any of these flow rates depending on the precursor used, which may be any number of hydrogen-containing precursors. For example, in embodiments in which water vapor is utilized, the vapor may be introduced at a rate of at least or about 0.1 g/min until sufficient water has been introduced, which may be less than one minute of time. The water vapor may also be introduced at a rate of at least or about 0.2 g/min, at least or about 0.3 g/min, at least or about 0.4 g/min, at least or about 0.5 g/min, at least or about 0.6 g/min, at least or about 0.7 g/min, at least or about 0.8 g/min, at least or about 0.9 g/min, at least or about 1 g/min, at least or about 1.5 g/min, or more, although the vapor may be introduced below about 5 g/min or below or about 1 g/min to reduce or limit condensation and/or freezing on other components of the chamber and the substrate. The water vapor may also be introduced at a flow rate between any of these stated flow rates, or within smaller ranges encompassed by any of these numbers before being halted.

Second layer 508 of the spacer may be fully removed or partially removed, as previously discussed, while substantially or essentially maintaining first spacer layer 506. Although partial rounding at top portions of spacer layer 506 may occur depending on the materials forming each layer of the spacer 505, minimal removal of spacer layer 506 may occur, as well as removal of any of the other exposed layers including metal-containing layers, and the layers may be more than 50% maintained from an initial formation amount. In some embodiments the other layers may be more than 60% maintained from an initial formation amount, more than 70% maintained from an initial formation amount, more than 80% maintained from an initial formation amount, more than 90% maintained from an initial formation amount, more than 95% maintained from an initial formation amount, more than 97% maintained from an initial formation amount, more than 99% maintained from an initial formation amount, or more.

Because water may be generated to sustain the reaction only as long as additional silicon oxide or other oxide material is present, processes according to the present technology may also be self-limiting. Once the oxide material has been removed, no further water generation may occur, and the process may cease. Additionally, because the water may be limited to the oxide material once the initial injection of water has been consumed or dissipated from other surfaces, the present technology may afford high selectivity and protection of other exposed materials. The present technology may selectively etch silicon oxide, silicon oxycarbide, silicon oxycarbonitride, or other oxygen-containing materials relative to other materials, and may selectively etch some types of silicon oxide relative to other types of silicon oxide. For example, the present technology may etch deposited silicon oxides relative to thermal oxide at a rate of at least about 10:1, and may etch deposited oxides relative to thermal oxide at a rate of at least about 15:1, at least about 20:1, at least about 50:1, at least about 100:1, or more. Deposited oxides may include spin on dielectrics, or deposition techniques including CVD, PECVD, and other deposition techniques. The present technology may also etch any of the oxygen-containing materials relative to silicon nitride, silicon carbon nitride films having any ratio of carbon and nitrogen, or silicon oxycarbonitride, at a rate of at least about 20:1, at least about 25:1, at least about 30:1, at least about 50:1, at least about 100:1, at least about 150:1, at least about 200:1, at least about 250:1, at least about 300:1, at least about 350:1, at least about 400:1, at least about 450:1, at least about 500:1, or more. The processes described may similarly etch the oxygen-containing materials relative to any of the metal or metal-containing materials previously described, and may produce any of the selectivities as noted above with respect to these additional materials.

The previously discussed methods may allow the removal of oxide material from a substrate, which may be from high-aspect-ratio features, while maintaining other materials including metal and metal-containing materials, and other silicon-containing materials. By utilizing the present methods and operations, high-aspect-ratio features having relatively thin widths of initial exposure may be etched while not causing pattern collapse, unlike wet etching, and while not removing or while substantially maintaining other exposed material layers, unlike some conventional dry etching.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
   flowing a hydrogen-containing precursor into a substrate processing region of a semiconductor processing chamber;
   flowing a fluorine-containing precursor into the substrate processing region;
   contacting a substrate housed in the substrate processing region with the hydrogen-containing precursor and the fluorine-containing precursor, wherein the substrate defines a trench, wherein a layer of an oxygen-containing material is disposed within the trench and exposed on the substrate;
   halting delivery of the hydrogen-containing precursor for a remainder of the etching method while continuing to flow the fluorine-containing precursor; and
   removing the oxygen-containing material, during the continued flowing of the fluorine-containing precursor.

2. The etching method of claim 1, wherein the hydrogen-containing precursor is maintained fluidly isolated from a plasma formable within the semiconductor processing chamber in a remote plasma region of the semiconductor processing chamber.

3. The etching method of claim 1, wherein the hydrogen-containing precursor comprises water vapor.

4. The etching method of claim 1, wherein the fluorine-containing precursor comprises anhydrous hydrogen fluoride.

5. The etching method of claim 1, wherein the substrate further comprises an exposed region of hafnium oxide, zirconium oxide, or aluminum oxide.

6. The etching method of claim 1, wherein the oxygen-containing material is selected from the group consisting of silicon dioxide, silicon oxycarbide, silicon oxynitride, and silicon oxycarbonitride.

7. The etching method of claim 1, wherein the etching method is performed at a temperature below or about 0° C.

8. The etching method of claim 7, wherein the etching method is performed at a temperature above a freezing point of water at operating chamber conditions.

9. The etching method of claim 1, wherein the fluorine-containing precursor is flowed at a flow rate below or about 1 slm during the etching method.

10. The etching method of claim 9, wherein the fluorine-containing precursor is pulsed during the etching method.

11. The etching method of claim 10, wherein the fluorine-containing precursor is pulsed off for at least two seconds during each cycle of pulsing performed during the etching method.

12. The etching method of claim 1, wherein the substrate processing region is maintained plasma free during the etching method.

13. A removal method comprising:
flowing water vapor into a substrate processing region at a temperature below or about 0° C.;
flowing a fluorine-containing precursor into the substrate processing region of a semiconductor processing chamber;
contacting a substrate housed in the substrate processing region with the water vapor and the fluorine-containing precursor, wherein the substrate defines a trench, wherein a layer of an oxygen-containing material is disposed within the trench and exposed on the substrate;
halting the flow of water vapor for a remainder of the removal method while maintaining the flow of the fluorine-containing precursor; and
removing the oxygen-containing material, during the maintained flow of the fluorine-containing precursor.

14. The removal method of claim 13, wherein the water vapor is delivered into the substrate processing region at a temperature above or about −40° C.

15. The removal method of claim 13, wherein the fluorine-containing precursor is flowed at a rate of less than or about 500 sccm during the removal method.

16. The removal method of claim 13, wherein the fluorine-containing precursor is delivered in pulses, wherein the delivery is characterized by a first period of time during which the fluorine-containing precursor is flowed, and a second period of time during which the fluorine-containing precursor flow is halted.

17. The removal method of claim 16, wherein the first period of time and the second period of time are both greater than or about 2 seconds.

18. The removal method of claim 13, wherein the fluorine-containing precursor is anhydrous hydrogen fluoride, and wherein the substrate processing region is maintained plasma-free during the removal method.

19. An etching method comprising:
flowing a hydrogen-containing precursor into a substrate processing region of a semiconductor processing chamber while maintaining the substrate process region at a temperature between about −50° C. and about 0° C.;
flowing anhydrous hydrogen fluoride into the substrate processing region;
contacting a substrate housed in the substrate processing region with the hydrogen-containing precursor and the anhydrous hydrogen fluoride, wherein the substrate defines a trench, wherein a layer of an oxygen-containing material is disposed within the trench and exposed on the substrate;
halting the flow of the hydrogen-containing precursor for a remainder of the etching method while continuing to flow the anhydrous hydrogen fluoride; and
removing the oxygen-containing material, during the continued flowing of the anhydrous hydrogen fluoride.

* * * * *